United States Patent
Li et al.

(10) Patent No.: US 12,141,383 B2
(45) Date of Patent: Nov. 12, 2024

(54) DISPLAY PANEL AND MANUFACTURING METHOD THEREOF

(71) Applicant: Wuhan China Star Optoelectronics Semiconductor Display Technology Co., Ltd., Hubei (CN)

(72) Inventors: Bo Li, Hubei (CN); Wenxu Xianyu, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 290 days.

(21) Appl. No.: 16/973,188

(22) PCT Filed: Aug. 17, 2020

(86) PCT No.: PCT/CN2020/109625
§ 371 (c)(1),
(2) Date: Dec. 8, 2020

(87) PCT Pub. No.: WO2022/027727
PCT Pub. Date: Feb. 10, 2022

(65) Prior Publication Data
US 2022/0229506 A1    Jul. 21, 2022

(30) Foreign Application Priority Data

Aug. 7, 2020  (CN) .......................... 202010790492.4

(51) Int. Cl.
*G06F 3/044*    (2006.01)
*G06F 3/041*    (2006.01)
(Continued)

(52) U.S. Cl.
CPC .......... *G06F 3/0412* (2013.01); *G06F 3/0443* (2019.05); *G06F 3/0446* (2019.05);
(Continued)

(58) Field of Classification Search
CPC .... G06F 3/0412; G06F 3/0446; G06F 3/0443; G06F 2203/04103; G06F 2203/04111;
(Continued)

(56) References Cited

U.S. PATENT DOCUMENTS 11,429,235 B2 *  8/2022  Kim ..................... G06F 3/0443
2015/0193054 A1  7/2015  Chung
(Continued)

FOREIGN PATENT DOCUMENTS

CN    108108073    6/2018
CN    109062430    12/2018
(Continued)

*Primary Examiner* — Parul H Gupta

(57) ABSTRACT

A display panel and a manufacturing method thereof are disclosed. The display panel includes a fingerprint recognition area and a touch control area surrounding the fingerprint recognition area. In the fingerprint recognition area, transparent conductive units in one direction are connected to form first electrodes by second connecting lines, and the transparent conductive units in another direction are bridged to form second electrodes by first connecting lines.

7 Claims, 3 Drawing Sheets

(51) Int. Cl.
*G06V 40/13* (2022.01)
*H10K 59/40* (2023.01)

(52) U.S. Cl.
CPC .................. *G06V 40/1306* (2022.01); *G06F 2203/04103* (2013.01); *G06F 2203/04111* (2013.01); *G06F 2203/04112* (2013.01); *H10K 59/40* (2023.02)

(58) Field of Classification Search
CPC ...... G06F 2203/04112; G06V 40/1306; H01L 27/323
See application file for complete search history.

(56) References Cited

U.S. PATENT DOCUMENTS

| | | | |
|---|---|---|---|
| 2016/0103516 A1* | 4/2016 | An | H10K 59/35 |
| | | | 345/174 |
| 2016/0147336 A1* | 5/2016 | Han | H05K 1/0296 |
| | | | 345/174 |
| 2018/0039349 A1* | 2/2018 | Han | G06F 3/041 |
| 2018/0068156 A1* | 3/2018 | Jang | G06V 40/1306 |
| 2019/0018540 A1* | 1/2019 | Ko | G06F 3/0445 |
| 2019/0138131 A1* | 5/2019 | Kim | G06V 40/1306 |
| 2019/0146611 A1* | 5/2019 | Park | G06F 3/0412 |
| | | | 345/174 |

FOREIGN PATENT DOCUMENTS

| | | |
|---|---|---|
| CN | 109814753 | 5/2019 |
| CN | 209297323 | 8/2019 |
| CN | 111240516 | 6/2020 |
| KR | 10-2017-0051797 | 5/2017 |

\* cited by examiner

DISPLAY PANEL AND MANUFACTURING METHOD THEREOF

RELATED APPLICATIONS

This application is a National Phase of PCT Patent Application No. PCT/CN2020/109625 having International filing date of Aug. 17, 2020, which claims the benefit of priority of Chinese Patent Application No. 202010790492.4 filed on Aug. 7, 2020. The contents of the above applications are all incorporated by reference as if fully set forth herein in their entirety.

FIELD AND BACKGROUND OF THE INVENTION

The present disclosure relates to the field of display technologies, and more particularly, to a display panel and a manufacturing method thereof.

In the case that full screen mobile phones have been widely used, in-screen fingerprint recognition technology has become a key technology in the consumer electronics field due to its convenient identity authentication operation. Optical under-display fingerprint recognition is mainly used in current in-screen fingerprint recognition technology, which uses light-emitting pixels of organic light-emitting diode (OLED) displays as light sources and uses micro lens of fingerprint modules to read reflected light of a fingerprint and convert it into electric signals, thereby reading a fingerprint image. However, attaching external fingerprint recognition modules requires mechanical materials such as buffer foam and copper heat sinks to be hollowed out, which occupies whole machine structural space and adds additional product cost.

Technical problem: an objective of the present disclosure is to solve technical problems of high cost and great thicknesses of display devices caused by current display devices requiring to attach external fingerprint recognition modules.

SUMMARY OF THE INVENTION

To realize the above objective, the present disclosure provides a display panel having a fingerprint recognition area and a touch control area surrounding the fingerprint recognition area and including: a substrate layer; an encapsulation layer disposed on one side surface of the substrate layer; a first conductive layer having a plurality of metal meshes and first connecting lines; and a second conductive layer having a plurality of transparent conductive units and second connecting lines, wherein each of the transparent conductive units is correspondingly disposed on the metal meshes; wherein in the fingerprint recognition area, the transparent conductive units of each row are connected to form first electrodes by the second connecting lines, and the transparent conductive units of each column are bridged to form second electrodes by the first connecting lines; or the transparent conductive units of each column are connected to form the first electrodes by the second connecting lines, and the transparent conductive units of each row are bridged to form the second electrodes by the first connecting lines.

Further, each of the metal meshes surrounds one pixel, and each of the transparent conductive units covers the pixel.

Further, smaller sizes of pixels surrounded by the metal meshes indicate wider line widths of the metal meshes corresponding to the pixels.

Further, the metal meshes among adjacent pixels in the fingerprint recognition area are independent from each other, and the metal meshes among the pixels in the touch control area have commonly-owned parts.

Further, a shape of the metal meshes in the fingerprint recognition area is different from a shape of the metal meshes in the touch control area.

Further, in the touch control area, the metal meshes of each row are connected to form the first electrodes by the first connecting lines, and the metal meshes of each column are bridged to form the second electrodes by the second connecting lines; or the metal meshes of each column are connected to form the first electrodes by the first connecting lines, and the metal meshes of each row are bridged to form the second electrodes by the second connecting lines.

Further, the second conductive layer uses a composite structure of ITO/Ag/ITO, and the first conductive layer uses a composite structure of Ti/Al/Ti.

Further, the display panel further includes an insulating layer disposed between the first conductive layer and the second conductive layer.

To realize the above objective, the present disclosure further provides a manufacturing method of a display panel, which includes following steps: providing a substrate layer provided with an encapsulation layer; manufacturing a plurality of metal meshes and first connecting lines on an upper surface of the encapsulation layer to form a first conductive layer; and manufacturing a plurality of transparent conductive units and second connecting lines on an upper surface of the first conductive layer to form a second conductive layer, and forming a fingerprint recognition area and a touch control area; wherein in the fingerprint recognition area, the transparent conductive units of each row are connected to form first electrodes by the second connecting lines, and the transparent conductive units of each column are bridged to form second electrodes by the first connecting lines; or the transparent conductive units of each column are connected to form the first electrodes by the second connecting lines, and the transparent conductive units of each row are bridged to form the second electrodes by the first connecting lines.

Further, before the step of manufacturing the plurality of transparent conductive units and second connecting lines on the upper surface of the first conductive layer to form the second conductive layer, the manufacturing method of the display panel further includes: manufacturing an insulating layer on the upper surface of the first conductive layer; and manufacturing a plurality of contact holes on the insulating layer; wherein in the touch control area, the metal meshes of each row are connected to form first electrodes by the first connecting lines, and the metal meshes of each column are bridged to form second electrodes by the second connecting lines; or the metal meshes of each column are connected to form the first electrodes by the first connecting lines, and the metal meshes of each row are bridged to form the second electrodes by the second connecting lines.

Beneficial effect: technical effects of the present disclosure are that the present disclosure uses a structural design of combining the metal meshes and the transparent electrodes, and defines the fingerprint recognition area and the touch control area on an upper surface of the encapsulation layer and on a same layer, thereby realizing integrated fingerprint recognition and touch control functions. Under premise of ensuring the fingerprint recognition and touch control functions, it is not necessary for the present disclosure to attach external fingerprint recognition modules. Therefore, product cost is reduced, and meanwhile, a thickness of the display panel is also reduced, thereby effectively improving quality of the display panel.

BRIEF DESCRIPTION OF THE SEVERAL VIEWS OF THE DRAWINGS

The technical solutions and other beneficial effects of the present disclosure will be made obvious by describing the specific embodiments of the present disclosure in detail in conjunction with the accompanying drawings.

Figure 1:
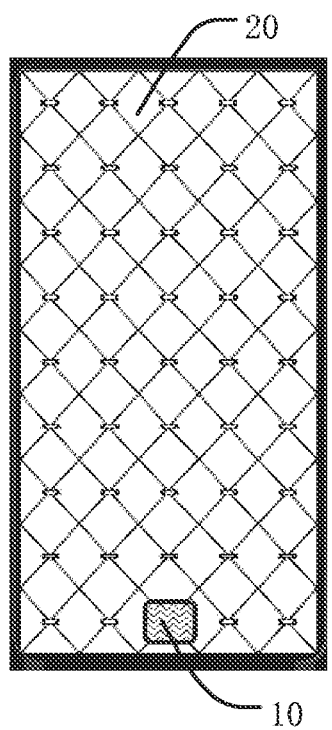
FIG. 1 is a schematic top view of a display panel according to an embodiment of the present disclosure.

Elements in the drawings are designated by reference numerals listed below.
- 10. fingerprint recognition area; 20. touch control area;
- 11. first conductive layer; 111. first metal meshes; 112. first connecting line;
- 12. second conductive layer; 121. first transparent conductive units; 122. second connecting line;
- 13. first insulating layer; 131. first contact hole;
- 21. first conductive layer; 211. second metal meshes; 212. first connecting line;
- 22. second conductive layer; 221. second transparent conductive units; 222. second connecting line;
- 23. second insulating layer; 231. second contact hole;
- 1. substrate layer; 2. array layer; 3. encapsulation layer; 210. pixel.

DESCRIPTION OF SPECIFIC EMBODIMENTS OF THE INVENTION

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", "clockwise", "counterclockwise", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or implicitly indicating the number of technical features indicated. Thus, features limited by "first" and "second" are intended to indicate or imply including one or more than one of these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrated connection; it can mean a mechanical connection, an electrical connection, or can communicate with each other; it can mean a direct connection, an indirect connection by an intermediary, or an inner communication or an inter-reaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

The following disclosure provides many different embodiments or examples for realizing different structures of the present disclosure. In order to simplify the present disclosure, the components and settings of a specific example are described below. Of course, they are merely examples and are not intended to limit the present disclosure. In addition, the present disclosure may repeat reference numerals and/or reference letters in different examples, which are for the purpose of simplicity and clarity, and do not indicate the relationship between the various embodiments and/or arrangements discussed. In addition, the present disclosure provides examples of various specific processes and materials, but one of ordinary skill in the art will recognize the use of other processes and/or the use of other materials.

Specifically, referring to FIGS. 1 to 5, an embodiment of the present disclosure provides a display panel, which includes a fingerprint recognition area 10 and a touch control area 20. The display panel also includes a substrate layer 1, an array layer 2, and an encapsulation layer 3, and the fingerprint recognition area 10 and the touch control area 20 are defined on an upper surface of the encapsulation layer 3 and on a same layer.

The substrate layer 1 may be a flexible substrate layer or a hard substrate, which has effect of being a substrate and is not limited herein.

The array layer 2 is disposed on an upper surface of the substrate layer 1 and includes circuit elements such as thin film transistors and a plurality of pixels 210. Since shapes and sizes of the pixels 210 are different, areas of light-emitting areas are not completely same, either.

The encapsulation layer 3 is disposed on an upper surface of the array layer 2 and is configured to block external water and oxygen from eroding the display panel, thereby preventing problems such as nonuniform display caused by water and oxygen entering the display panel.

Figure 2:
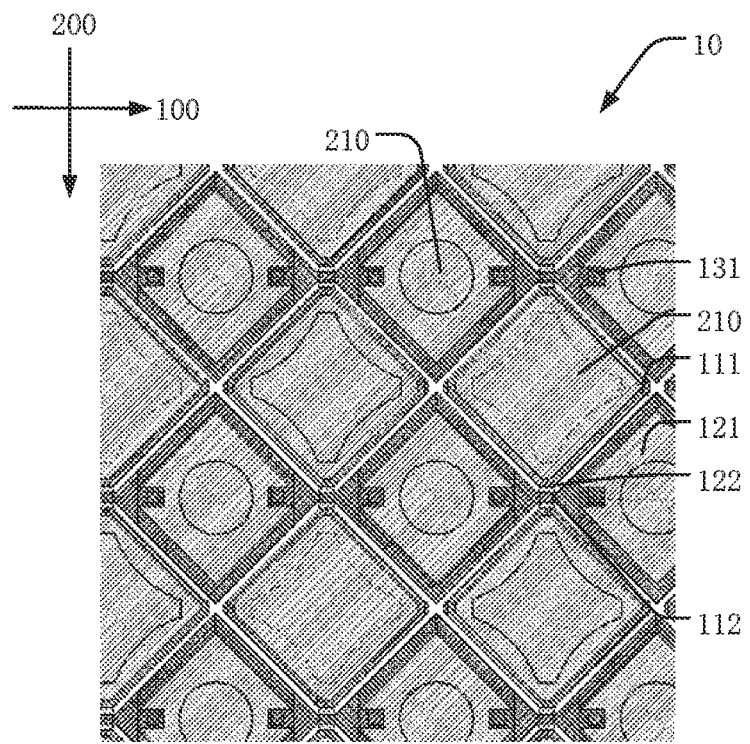
FIG. 2 is a schematic top view of a fingerprint recognition area according to an embodiment of the present disclosure.

As shown in FIG. 1, the fingerprint recognition area 10 is positioned in a lower-middle part of the display panel and is configured to identify fingerprint signals. As shown in FIG. 2, sensing routes in the fingerprint recognition area 10 include a first direction 100 and a second direction 200 perpendicular to the first direction 100. In this embodiment, the first direction 100 is a horizontal direction (that is, a row direction), and the second direction 200 is a vertical direction (that is, a column direction).

Figure 3:
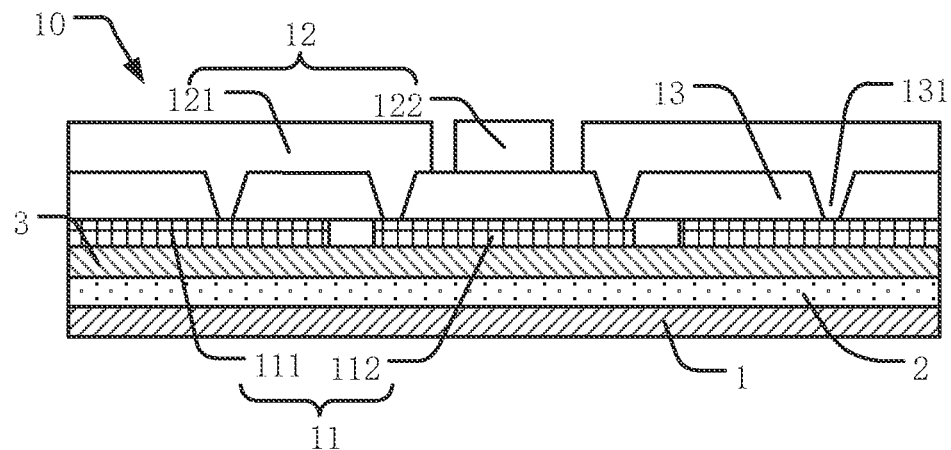
FIG. 3 is a schematic cross-sectional diagram of the fingerprint recognition area according to an embodiment of the present disclosure.

As shown in FIGS. 2 and 3, the fingerprint recognition area 10 includes a first conductive layer 11, a second conductive layer 12, and an insulating layer 13 disposed between the first conductive layer and the second conductive layer.

A material of the first conductive layer 11 is a metal material, and the first conductive layer 11 includes a plurality of first metal meshes 111 and first connecting lines 112. The first conductive layer 11 is directly disposed on an upper surface of the encapsulation layer 3 and is formed by stacking multiple layers of metal materials. In this embodiment, it is preferably a composite structure of Ti/Al/Ti. The above metal materials have good conductivity, so the first metal meshes 111 have good conductivity, thereby ensuring electrical connections between the first metal meshes 111 and first transparent conductive units 121.

The first metal meshes 111 are generally square or other meshed shapes, and each of the first metal meshes 111 is disposed corresponding to each of the pixels 210 of the array layer 2 with one-to-one size matching design. Orthographic projections of the first metal meshes 111 on the substrate layer 1 surround orthographic projections of the pixels 210 on the substrate layer 1, that is, an area surrounded by one of the first metal meshes 111 is greater than an area of one of the pixels 210. Therefore, areas where the pixels 210 are located are avoided and normal light-emitting display of the pixels 210 is not affected.

The first insulating layer 13 is disposed on an upper surface of the first conductive layer 11 and has an effect to insulate most of the first conductive layer 11 from the second conductive layer 12. The first insulating layer 13 is provided with a plurality of first contact holes 131 penetrating through the first insulating layer 13 and exposing the underneath first conductive layer 11. The first contact holes 131 provide channels for electrical connections between the first conductive layer 11 and the second conductive layer 12.

A material of the second conductive layer 12 is a transparent material, and the second conductive layer 12 is disposed on an upper surface of the first insulating layer 13. The second conductive layer 12 includes the first transparent conductive units 121 and second connecting lines 122. The material of the second conductive layer 12 is different from the material of the first conductive layer 11. The second conductive layer 12 uses a composite structure of ITO/Ag/ITO, which has good light transmittance. The first transparent conductive units 121 cover areas surrounded by the first metal meshes 111 and are disposed right above the pixels 210 (referring to FIG. 2). The second connecting lines 122 are disposed on the first connecting lines 112, and each of the second connecting lines 122 is used to connect two of adjacent first transparent conductive units 121.

In the first direction 100, sensing channels thereof are divided into two layers: the first conductive layer 11 and the second conductive layer 12. The first connecting lines 112 serve as metal bridges of the first transparent conductive units 121, the first transparent conductive units 121 are partially disposed in the first contact holes 131, and two of the first transparent conductive units 121 form an electrical connection by one of the first connecting lines 112, thereby forming second electrodes, in this embodiment, forming fingerprint drive electrodes.

In the second direction 200, sensing channels thereof are also divided into the two layers: the first conductive layer 11 and the second conductive layer 12. Two of the adjacent first transparent conductive units 121 are directly connected to each other by one of the second connecting lines 122, thereby forming first electrodes which are in contact with each other directly, in this embodiment, forming fingerprint sense electrodes.

A special structural design of combining metal meshes and transparent conductive units can effectively reduce impedance of channels and improve intensities of sensing signals.

Since the sizes of the pixels 210 surrounded by the drive electrodes of the first direction 100 and the sense electrodes of the second direction 200 in the fingerprint recognition area 10 are different, sizes of the two kinds of electrodes are also different. The smaller sizes of the pixels 210 surrounded by the first metal meshes 111 are, the wider line widths of the first metal meshes 111 corresponding to the pixels 210 are. In this embodiment, compensation and matching between impedance and area sizes of the two kinds of electrodes are realized by adjusting the line widths of the first metal meshes 111, that is, the line widths of the first metal meshes 111 in the first direction 100 are greater than the line widths of the first metal meshes 111 in the second direction 200, thereby ensuring intensities of mutual capacitance sensing signals and realizing high sensitive fingerprint recognition induction.

Figure 4:
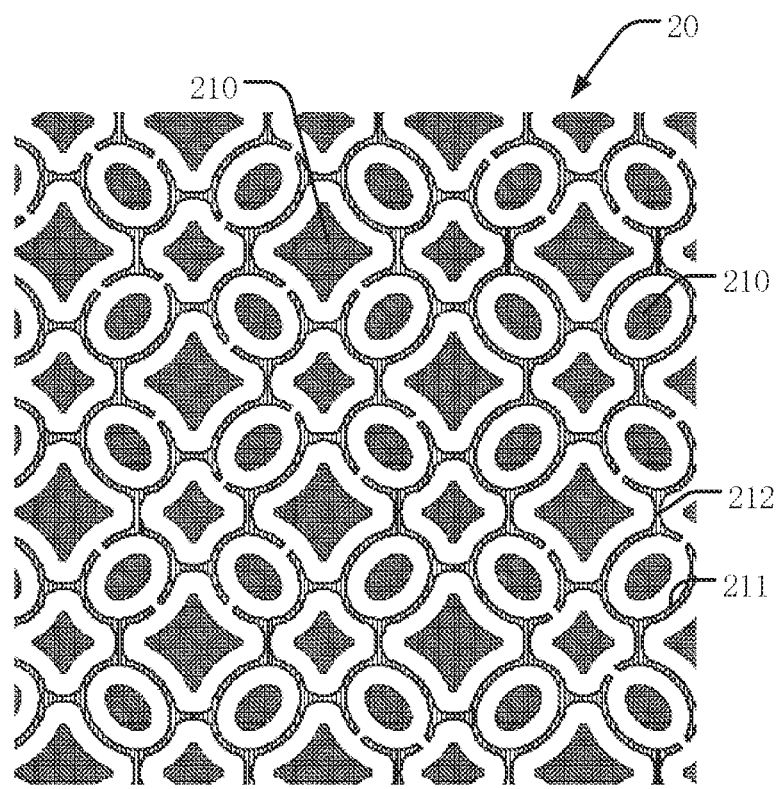
FIG. 4 is a schematic top view of a touch control area according to an embodiment of the present disclosure.
Figure 5:
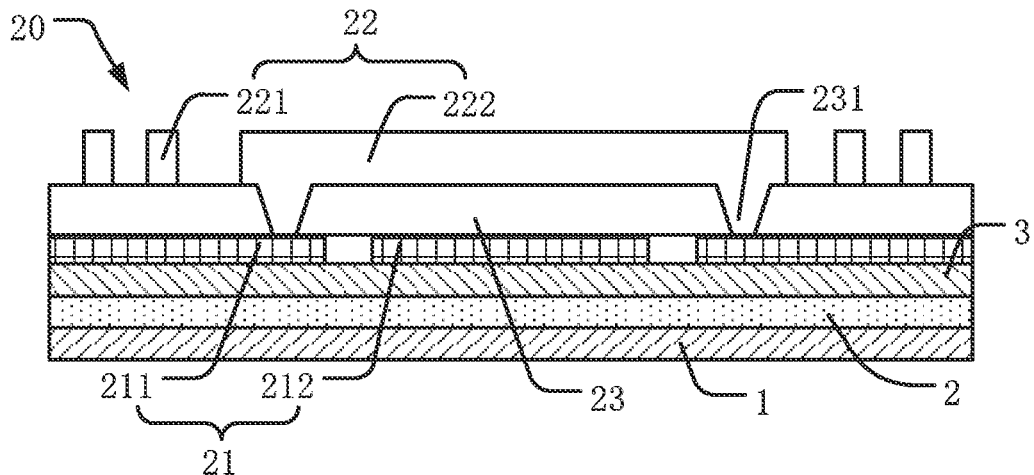
FIG. 5 is a schematic cross-sectional diagram of the touch control area according to an embodiment of the present disclosure.

As shown in FIG. 1, the touch control area 20 surrounds the fingerprint recognition area 10. As shown in FIGS. 4 and 5, the touch control area 20 includes a first conductive layer 21 and a second conductive layer 22 and a second insulating layer 23 disposed between the first conductive layer 21 and the second conductive layer 22.

A material of the first conductive layer 21 is a metal material, and the first conductive layer 21 is directly disposed on the upper surface of the encapsulation layer 3 and includes a plurality of second metal meshes 211 and first connecting lines 212. The second metal meshes 211 and the first metal meshes 111 are disposed on a same layer. The first conductive layer 21 is formed by stacking multiple layers of metal materials. In this embodiment, it is preferably the composite structure of Ti/Al/Ti. The above metal materials have good conductivity, so the first conductive layer 21 has good conductivity, thereby ensuring electrical connections between the first conductive layer 21 and the second conductive layer 22.

In this embodiment, shapes of the second metal meshes 211 are different from shapes of the first metal meshes 111. The shapes of the second metal meshes 211 are oval, and each of the second metal meshes 211 is disposed corresponding to each of the pixels 210 of the array layer 2 with one-to-one size matching design. Orthographic projections of the second metal meshes 211 on the substrate layer 1 surround the orthographic projections of the pixels 210 on the substrate layer 1, that is, an inner diameter of the second metal meshes 211 is greater than a width of the pixels 210. Therefore, the areas where the pixels 210 are located are avoided and the normal light-emitting display of the pixels 210 is not affected. Meanwhile, the second metal meshes 211 adopt a cut-off design (referring to FIG. 4), and the second metal meshes 211 among adjacent pixels 210 have commonly-owned parts, thereby preventing short circuits between adjacent electrodes.

The second insulating layer 23 is disposed on an upper surface of the first conductive layer 21 and has an effect to insulate most of the first conductive layer 21 from the second conductive layer 22. The second insulating layer 23 is provided with a plurality of second contact holes 231 penetrating through the second insulating layer 23 and exposing the underneath first conductive layer 21. The second contact holes 231 provide channels for electrical connections between the first conductive layer 21 and the second conductive layer 22.

A material of the second conductive layer 22 is a transparent material, and the second conductive layer 22 is disposed on an upper surface of the second insulating layer 23. The second conductive layer 22 includes a plurality of second transparent conductive units 221 and second connecting lines 222. The material of the second conductive layer 22 is different from the material of the first conductive layer 21. The second conductive layer 22 uses the composite structure of ITO/Ag/ITO, which has good light transmittance. The second transparent conductive units 221 cover areas surrounded by the second metal meshes 211 and are disposed right above the pixels 210 (not shown in FIG. 5). The second transparent conductive units 221 are in an isolated state and are auxiliary electrodes (dummy electrodes), and the auxiliary electrodes are not used for electrical connections but used to maintain optical consistency between the touch control area 20 and the fingerprint recognition area 10.

In the touch control area 20, the second connecting lines 222 serve as bridges for the second metal meshes 211 and are partially disposed in the second contact holes 231. Two of the second metal meshes 211 form an electrical connection by one of the second connecting lines 222. In this embodiment, the second connecting lines 222 and the second metal meshes 211 electrically connected thereto form touch control drive electrodes.

The special structural design of combining the metal meshes and the transparent conductive units can effectively reduce the impedance of channels and improve the intensities of sensing signals.

In the fingerprint recognition area 10, the first transparent conductive units 121 of each row are connected to form the first electrodes by the second connecting lines 122, and the first transparent conductive units 121 of each column are bridged to form the second electrodes by the first connecting lines 112; or the first transparent conductive units 121 of each column are connected to form the first electrodes by the second connecting lines 122, and the first transparent conductive units 121 of each row are bridged to form the second electrodes by the first connecting lines 112.

In the touch control area 20, the second metal meshes 211 of each row are connected to form the first electrodes by the first connecting lines 212, and the second metal meshes 211 of each column are bridged to form the second electrodes by the second connecting lines 222; or the second metal meshes 211 of each column are connected to form the first electrodes by the first connecting lines 212, and the second metal meshes 211 of each row are bridged to form the second electrodes by the second connecting lines 222.

The present disclosure uses a structural design of combining the metal meshes and the transparent electrodes, and defines the fingerprint recognition area 10 and the touch control area 20 on the upper surface of the encapsulation layer 3 and on a same layer, thereby realizing integrated fingerprint recognition and touch control functions. Under premise of ensuring the fingerprint recognition and touch control functions, it is not necessary for the present disclosure to attach external fingerprint recognition modules. Therefore, product cost is reduced, and meanwhile, a thickness of the display panel is also reduced, thereby effectively improving quality of the display panel.

Figure 6:
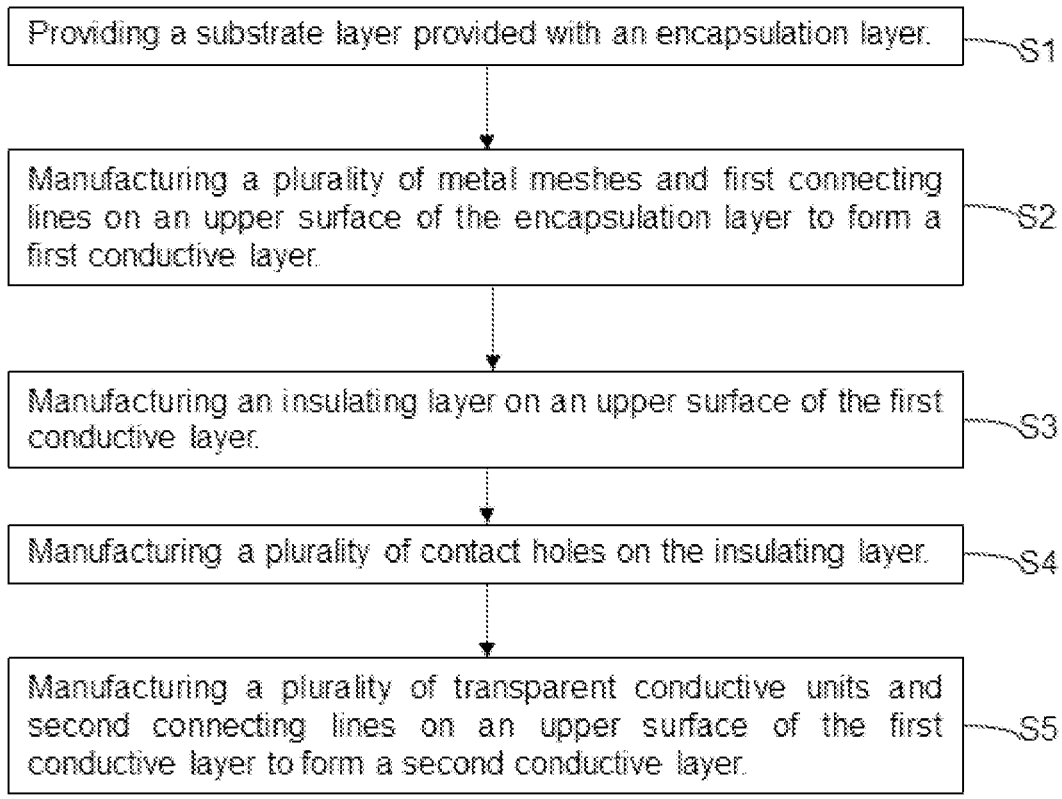
FIG. 6 is a flowchart of a manufacturing method of a display panel according to an embodiment of the present disclosure.

As shown in FIG. 6, an embodiment of the present disclosure further provides a manufacturing method of a display panel, which includes steps S1 to S5.

S1: providing a substrate layer provided with an encapsulation layer. An array layer and the encapsulation layer are disposed on the substrate layer in sequence, and a plurality of light-emitting pixels are disposed in the array layer and form a plurality of light-emitting areas.

S2: manufacturing a plurality of metal meshes and first connecting lines on an upper surface of the encapsulation layer to form a first conductive layer. The metal meshes include a plurality of first metal meshes and second metal meshes. The first metal meshes are square meshed structures, and the second metal meshes are oval meshed structures and have a cut-off design. The first metal meshes are disposed on a lower-middle part of entire encapsulation layer, and an area where the second metal meshes are located surrounds an area where the first metal meshes are located.

S3: manufacturing an insulating layer on an upper surface of the first conductive layer to have insulating effect.

S4: manufacturing a plurality of contact holes on the insulating layer, which includes first contact holes and second contact holes. Wherein, the first contact holes are disposed in the area where the first metal meshes are located, the second contact holes are disposed in the area where the second metal meshes are located, and the contact holes serve as electrical connection channels between the metal meshes and transparent electrodes.

S5: manufacturing a plurality of transparent conductive units and second connecting lines on an upper surface of the insulating layer to form a second conductive layer.

The first transparent conductive units are disposed in the area where the first metal meshes are located, the first transparent conductive units and the first metal meshes are all disposed above the light-emitting areas, and areas of orthographic projections thereof on the substrate layer are greater than areas of orthographic projections of the light-emitting areas on the substrate layer, thereby ensuring normal light-emitting display of the light-emitting pixels in the light-emitting areas. Wherein, the first connecting lines serve as metal bridges to connect two of disconnected first transparent conductive units through the first contact holes, thereby forming sensing channels, which are located in the fingerprint recognition area.

The second transparent conductive units are disposed in the area where the second metal meshes are located, the second transparent conductive units and the second metal meshes are all disposed above the light-emitting areas, and areas of orthographic projections thereof on the substrate layer are greater than the areas of orthographic projections of the light-emitting areas on the substrate layer, thereby ensuring normal light-emitting display of the light-emitting pixels in the light-emitting areas. Wherein, the second connecting lines serve as bridges to connect two of disconnected second metal meshes through the second contact holes, thereby forming sensing channels, which are located in the touch control area.

The fingerprint recognition area and the touch control area are manufactured on the upper surface of the encapsulation layer at a same time, and both the fingerprint recognition area and the touch control area adopt a structural design of combining the metal meshes and the transparent electrodes, thereby realizing integrated fingerprint recognition and touch control functions. Under premise of ensuring the fingerprint recognition and touch control functions, it is not necessary for the present disclosure to attach external fingerprint recognition modules. Therefore, product cost is reduced, and meanwhile, a thickness of the display panel is also reduced, thereby effectively improving quality of the display panel.

In the above embodiments, the description of each embodiment has its own emphasis. For the parts that are not described in detail in an embodiment, can refer to the detailed description of other embodiments above.

The display panel and the manufacturing method thereof provided by the embodiments of the present disclosure are described in detail above. The specific examples are applied in the description to explain the principle and implementation of the disclosure. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. A display panel having a fingerprint recognition area and a touch control area surrounding the fingerprint recognition area and comprising:
    a substrate layer;
    an encapsulation layer disposed on one side surface of the substrate layer;
    a first conductive layer having a plurality of metal meshes and first connecting lines; and
    a second conductive layer having a plurality of transparent conductive units and second connecting lines, wherein each of the transparent conductive units is correspondingly disposed on the metal meshes;
    wherein in the fingerprint recognition area, the transparent conductive units of each row are connected to form first electrodes by the second connecting lines, and the transparent conductive units of each column are bridged to form second electrodes by the first connecting lines; or the transparent conductive units of each column are connected to form the first electrodes by the second connecting lines, and the transparent conductive units of each row are bridged to form the second electrodes by the first connecting lines;
    wherein smaller sizes of pixels surrounded by the metal meshes indicate wider line widths of the metal meshes corresponding to the pixels;
    wherein the line widths of the metal meshes in a first direction are greater than the line widths of the metal meshes in a second direction perpendicular to the first direction;
    wherein the line widths of the metal meshes in the first direction are uniform and equal without variation, and the line widths of the metal meshes in the second direction are uniform and equal without variation;
    wherein the metal meshes in the first direction are formed in first rectangular loops respectively, widths of four sections of each first rectangular loop are uniform and equal, the metal meshes in the second direction are formed in second rectangular loops respectively, widths of four sections of each second rectangular loop are uniform and equal, and adjacent two of the first rectangular loops and the adjacent two of the second rectangular loops are arranged in a mesh array in which the first rectangular loops are arranged oppositely in a first diagonal of the mesh array and the second rectangular loops are arranged oppositely in a second diagonal of the mesh array.

2. The display panel according to claim 1, wherein each of the metal meshes surrounds one pixel, and each of the transparent conductive units covers the pixel.

3. The display panel according to claim 1, wherein the metal meshes among adjacent pixels in the fingerprint recognition area are independent from each other, and the metal meshes among the pixels in the touch control area have commonly-owned parts.

4. The display panel according to claim 1, wherein a shape of the metal meshes in the fingerprint recognition area is different from a shape of the metal meshes in the touch control area.

5. The display panel according to claim 1, wherein in the touch control area, the metal meshes of each row are connected to form the first electrodes by the first connecting lines, and the metal meshes of each column are bridged to form the second electrodes by the second connecting lines; or the metal meshes of each column are connected to form the first electrodes by the first connecting lines, and the metal meshes of each row are bridged to form the second electrodes by the second connecting lines.

6. The display panel according to claim 1, wherein the second conductive layer uses a composite structure of ITO/Ag/ITO, and the first conductive layer uses a composite structure of Ti/Al/Ti.

7. The display panel according to claim 1, further comprising an insulating layer disposed between the first conductive layer and the second conductive layer.

* * * * *